United States Patent
Lee

(10) Patent No.: US 7,569,884 B2
(45) Date of Patent: Aug. 4, 2009

(54) LDMOS TRANSISTOR

(75) Inventor: Suk Kyun Lee, Bucheong (KR)

(73) Assignee: Dongbu Electronics Co., Ltd., Seoul (KR)

( * ) Notice: Subject to any disclaimer, the term of this patent is extended or adjusted under 35 U.S.C. 154(b) by 474 days.

(21) Appl. No.: 11/319,481

(22) Filed: Dec. 29, 2005

(65) Prior Publication Data
US 2006/0145285 A1 Jul. 6, 2006

(30) Foreign Application Priority Data
Dec. 30, 2004 (KR) .................. 10-2004-0117144

(51) Int. Cl.
*H01L 31/119* (2006.01)
(52) U.S. Cl. .................. 257/343; 257/335; 257/336; 257/E29.266; 257/E29.261

(58) Field of Classification Search ............... 257/335, 257/328, E29.261, 343
See application file for complete search history.

(56) References Cited

U.S. PATENT DOCUMENTS

| 6,933,560 | B2 * | 8/2005 | Lee et al. ................. 257/328 |
| 7,067,878 | B2 * | 6/2006 | Ohyanagi et al. ........... 257/336 |
| 7,109,562 | B2 * | 9/2006 | Lee .......................... 257/488 |
| 7,126,193 | B2 * | 10/2006 | Baiocchi et al. ............ 257/343 |

* cited by examiner

*Primary Examiner*—Kenneth A Parker
*Assistant Examiner*—Jose R Diaz
(74) *Attorney, Agent, or Firm*—McKenna Long & Aldridge LLP

(57) ABSTRACT

A lateral DMOS transistor having a uniform distribution of channel impurity concentration includes a drift region of a first conductivity; a body of a second conductivity, the body being disposed in the drift region and has a channel thereon; and a source region of the first conductivity, the source region being disposed within the body and having an upper region surrounded by a first impurity region of the first conductivity.

9 Claims, 2 Drawing Sheets

US 7,569,884 B2

LDMOS TRANSISTOR

CROSS-REFERENCE TO RELATED APPLICATION

This application claims the benefit of Korean Patent Application No. 10-2004-0117144, filed on Dec. 30, 2004, which is hereby incorporated by reference as if fully set forth herein.

BACKGROUND OF THE INVENTION

1. Field of the Invention

The present invention relates to a semiconductor device, and more particularly, to a lateral double-diffused metal-oxide-semiconductor (LDMOS) having a uniform distribution of channel impurity concentration.

2. Discussion of the Related Art

Referring to FIG. 1, illustrating a conventional LDMOS transistor, an $n^-$ semiconductor substrate 100 has active region set according to a device isolation layer 110. A p-type body 120 and an $n^-$ extended drain region 130 are formed in the $n^-$ semiconductor substrate 100 to be separated from each other by a predetermined distance. An $n^+$ source region 140 is disposed on the p-type body 120. A channel 121, occurring in the p-type body 120 adjacent the $n^+$ source region 140, is overlapped by a gate isolating layer 160 and a gate conducting layer 170, which are sequentially formed atop the channel. Spacers are formed on the sidewalls of the gate conducting layer 170. An $n^+$ drain region 150 is disposed on the $n^-$ extended drain region 130. The structure is completed by a double diffusion process in which an ion implantation process is carried out twice, i.e., once before formation of the gate spacer layer 180 and again after its formation. The source and drain regions 140 and 150 are electrically connected with a source electrode S and a drain electrode D, respectively.

FIG. 2 shows the relative impurity concentrations with respect to the channel of the LDMOS transistor of FIG. 1. For example, the $n^+$ source region 140 exhibits an impurity concentration curve A1, which is relatively high and decreases toward the channel 121; the channel exhibits an impurity concentration curve B1 that is relatively low and decreases toward the $n^-$ drift region of the semiconductor substrate 100; and the drift region exhibits a uniform impurity concentration curve C1. To obtain a desirable breakdown voltage, the channel 121 should show a uniform distribution of its ion concentration. Since a contemporary LDMOS transistor has a grade junction, however, the length of the channel 121 cannot be reduced, which limits device integration.

SUMMARY OF THE INVENTION

Accordingly, the present invention is directed to an LDMOS transistor that substantially obviates one or more problems due to limitations and disadvantages of the related art.

The present invention provides an LDMOS transistor in which an impurity concentration is uniformly distributed in a channel so as to reduce the length of the channel.

Additional advantages and features of the invention will be set forth in part in the description which follows and will become apparent to those having ordinary skill in the art upon examination of the following. These and other advantages of the invention may be realized and attained by the structure particularly pointed out in the written description and claims hereof as well as the appended drawings.

To achieve these and other advantages in accordance with the invention, as embodied and broadly described herein, there is provided a lateral double-diffused MOS transistor comprising a drift region of a first conductivity; a body of a second conductivity, the body being disposed in the drift region and having a channel thereon; and a source region of the first conductivity, the source region being disposed within the body and having an upper region surrounded by a first impurity region of the first conductivity.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate exemplary embodiments of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Figure 1:
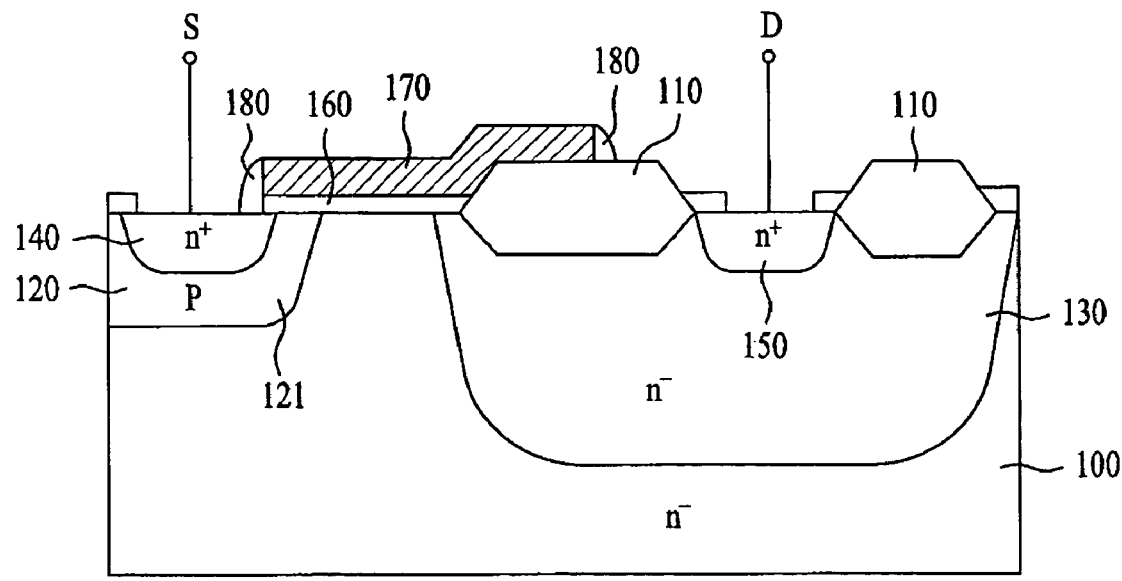
FIG. 1 is a sectional view of a conventional LDMOS transistor.
Figure 2:
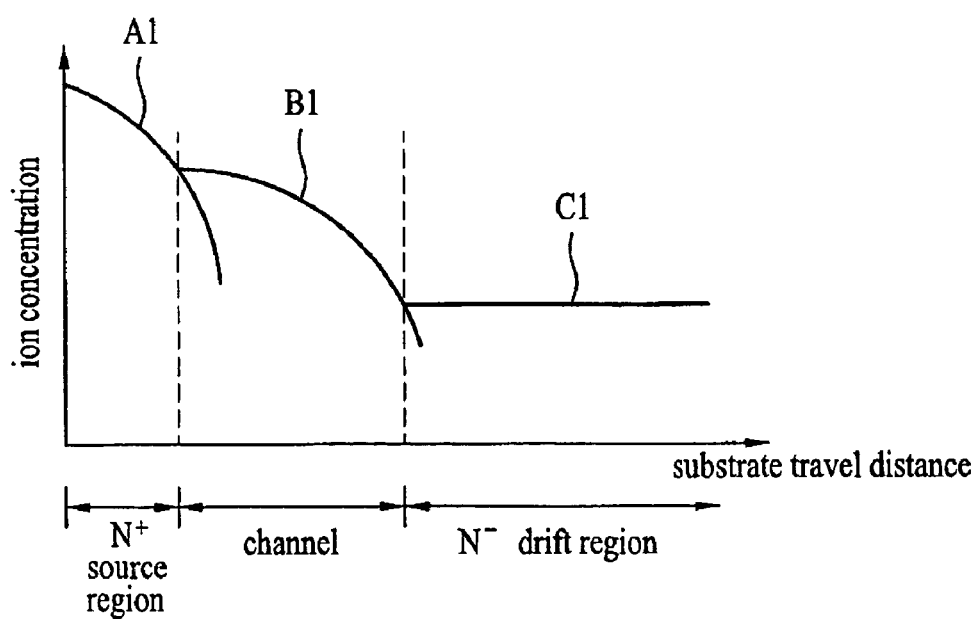
FIG. 2 is a graph illustrating impurity concentration with respect to the channel of the LDMOS transistor of FIG. 1.
Figure 3:
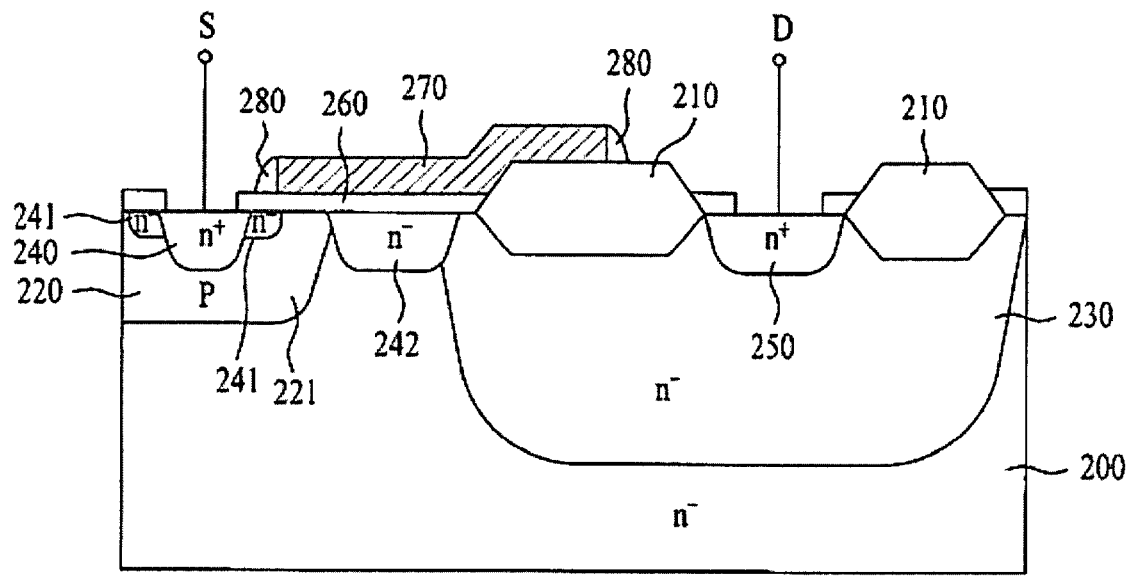
FIG. 3 is a sectional view of an LDMOS transistor according to the present invention.

Referring to FIG. 3, illustrating an LDMOS transistor according to the present invention, an $n^-$ semiconductor substrate 200 has an active region defined by a device isolation layer 210. The $n^-$ semiconductor substrate 200 serves as a drift region, and if necessary, such a drift region may be specifically formed. A p-type body 220 and an $n^-$ extended drain region 230 are formed in the $n^-$ semiconductor substrate 200 to be separated from each other. The p-type body 220 and an $n^-$ extended drain region 230 can be separated by a predetermined distance. An $n^+$ source region 240 is disposed within the p-type body 220 and has an upper region surrounded by an $n^-$ first impurity region 241. The disposition of the $n^-$ first impurity region 241, which has a lower impurity concentration than the $n^+$ source region 240, effectually shortens the length of a channel 221 occurring in an upper region of the p-type body 220.

An $n^-$ second impurity region 242 is disposed between the channel 221 and the $n^-$ extended drain region 230 on the surface of the $n^-$ semiconductor substrate 200. The $n^-$ second impurity region 242 has a higher impurity concentration than the $n^-$ semiconductor substrate 200. Thus, there is no falloff of the impurity concentration in the channel 221 toward the $n^-$ second impurity region 242. An end portion of the $n^-$ second impurity 242 may overlap an end portion of the channel 221, in which case the channel length becomes even shorter.

An $n^+$ drain region 250 is disposed on the $n^-$ extended drain region 230. A gate stack is formed atop the channel 221 by a sequential forming of the gate isolating layer 260 and gate conducting layer 270. Spacers 280 are formed on the sidewalls of the gate conducting layer 270. The structure is completed by a double diffusion process in which a first ion implantation process is carried out before the gate spacer layer 280 is formed, and a second ion implantation process is carried out after the gate spacer layer 280 is formed. The n⁺ source region 240 and the n⁺ drain region 250 are electrically connected with a source electrode S and a drain electrode D, respectively, using general wiring formation techniques.

Figure 4:
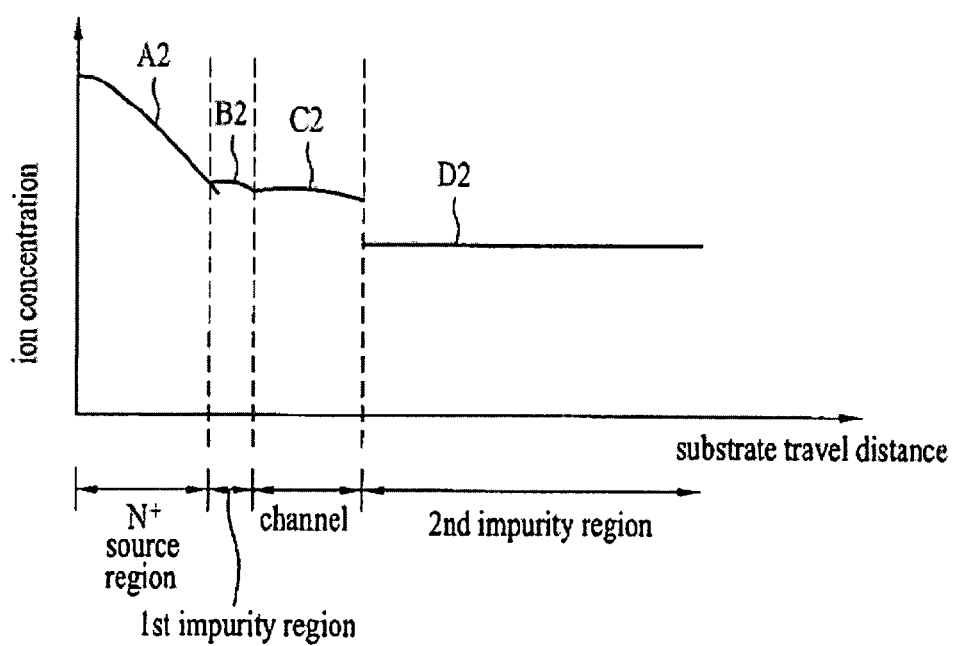
FIG. 4 is a graph illustrating impurity concentration with respect to the channel of the LDMOS transistor of FIG. 3.

FIG. 4 shows the relative impurity concentrations with respect to the channel of the LDMOS transistor of FIG. 3. For example, the n⁺ source region 240 exhibits an impurity concentration curve A2, which is relatively high and decreases toward the n⁻ first impurity region 241. The n⁻ first impurity region exhibits an impurity concentration curve B2, which is lower but shows a uniform ion distribution. The channel 221 in the p-type body 220 exhibits an impurity concentration curve C2, which also shows a fairly uniform ion distribution. The n⁻ second impurity region 242 exhibits an impurity concentration curve D2, which shows a very uniform ion distribution.

The uniform ion distribution of the channel 221 in the p-type body 220 is due to the n⁻ second impurity region 242, which has a lower concentration than the n⁻ semiconductor substrate 200, is disposed between the channel and the n⁻ extended drain region 230. Thus, the impurity concentration of the channel 221 shows a very nearly uniform distribution even near the n⁻ second impurity region 242.

Accordingly, in an LDMOS transistor of the present invention, a first impurity region surrounds a source region, thereby reducing the length of a channel occurring in a body. In addition, first and second impurity regions are disposed at either side of the channel, so that an impurity concentration shows a uniform ion distribution. As a result, channel length can be reduced, a sufficient breakdown voltage can be maintained, and an on-resistance characteristic can be improved.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A lateral double-diffused MOS transistor, comprising:
   a drift region having a first conductivity;
   a body having a second conductivity, said body being disposed in the drift region and having a channel thereon;
   a source region having the first conductivity, said source region being disposed within said body and having an upper region surrounded by a first impurity region having the first conductivity;
   an extended drain region having the first conductivity, said extended drain region being disposed in said drift region and separated from said body;
   a drain region having the first conductivity, said drain region being disposed in said extended drain region;
   a gate isolating layer and a gate conducting layer sequentially formed atop the channel occurring in said body; and
   a second impurity region having the first conductivity, said second impurity region being disposed between the channel and the extended drain region, wherein an end portion of the second impurity region overlaps an end portion of the channel.

2. The lateral double-diffused MOS transistor according to claim 1, wherein the first impurity region has a lower impurity concentration than that of said source region.

3. The lateral double-diffused MOS transistor according to claim 1, wherein said second impurity region has an impurity concentration higher than that of said drift region.

4. The lateral double-diffused MOS transistor according to claim 1, wherein the first conductivity is n-type and wherein the second conductivity is p-type.

5. The lateral double-diffused MOS transistor according to claim 1, wherein said drift region is formed by a semiconductor substrate having the first conductivity.

6. A method of manufacturing a lateral double-diffused MOS transistor, comprising:
   providing a drift region having a first conductivity;
   providing a body having a second conductivity, said body being disposed in the drift region and having a channel thereon;
   providing a source region having the first conductivity, said source region being disposed within said body and having an upper region surrounded by a first impurity region of the first conductivity;
   providing an extended drain region having the first conductivity, said extended drain region being disposed in said drift region and separated from said body;
   providing a drain region having the first conductivity, said drain region being disposed in said extended drain region;
   providing a gate isolating layer and a gate conducting layer sequentially formed atop the channel occurring in said body; and
   providing a second impurity region having the first conductivity, said second impurity region being disposed between the channel and the extended drain region, wherein an end portion of the second impurity region overlaps an end portion of the channel.

7. The method of claim 6, wherein the first impurity region has a lower impurity concentration than that of said source region.

8. The method of claim 6, wherein the first conductivity is n-type and wherein the second conductivity is p-type.

9. The method of claim 6, wherein said drift region is formed by a semiconductor substrate having the first conductivity.

* * * * *